United States Patent

Honda et al.

[11] Patent Number: 5,671,323
[45] Date of Patent: Sep. 23, 1997

[54] ZIGZAG HEATING DEVICE WITH DOWNWARD DIRECTED CONNECTING PORTIONS

[75] Inventors: Takaaki Honda, Mishima; Shinichi Mitani, Numazu, both of Japan

[73] Assignee: Toshiba Machine Co., Ltd., Tokyo, Japan

[21] Appl. No.: 598,629

[22] Filed: Feb. 12, 1996

Related U.S. Application Data

[63] Continuation of Ser. No. 319,248, Oct. 6, 1994, abandoned.

[30] Foreign Application Priority Data

Oct. 8, 1993 [JP] Japan .................. 5-253255

[51] Int. Cl.$^6$ .................. A21B 2/00; H05B 3/68; H01L 3/00
[52] U.S. Cl. .................. 392/418; 392/434; 219/465; 338/280
[58] Field of Search .................. 392/418, 416, 392/407, 433, 434; 219/552, 553, 537, 385, 445, 466, 390; 338/280, 289, 293, 295, 330, 332; 118/724, 725, 730; 427/557, 592, 593

[56] References Cited

U.S. PATENT DOCUMENTS

| 497,795 | 5/1893 | Jenkins | 338/280 |
| 2,042,233 | 5/1936 | Lockwood | 219/553 |
| 3,573,429 | 4/1971 | Brodbeck et al. | 392/432 |
| 4,410,796 | 10/1983 | Wilsey | 117/210 |
| 4,503,319 | 3/1985 | Moritoki et al. | 219/390 |
| 4,748,315 | 5/1988 | Takahashi et al. | 392/388 |

FOREIGN PATENT DOCUMENTS

| 76210 | 12/1947 | Czech Rep. | 338/280 |
| 1540067 | 12/1969 | Germany | 338/280 |
| 62-4315 | 1/1987 | Japan . | |
| 1239898 | 6/1986 | U.S.S.R. | 219/552 |

*Primary Examiner*—Teresa J. Walberg
*Assistant Examiner*—Sam Paik
*Attorney, Agent, or Firm*—Cushman Darby & Cushman Intellectual Property Group of Pillsbury Madison & Sutro, LLP

[57] ABSTRACT

A heating device has a plurality of strip heating portions separated by a plurality of slits. The strip heating portions are connected to one another by connecting portions, thereby forming a heating surface in which a zigzag current path extends. The connecting portions in which uneven-temperature regions exist are bent so as not to be positioned in the same plane as the heating surface, thereby making the heating surface, to be opposed to an object to be heated, to have a uniform temperature.

5 Claims, 6 Drawing Sheets

ZIGZAG HEATING DEVICE WITH DOWNWARD DIRECTED CONNECTING PORTIONS

This is a continuation of application Ser. No. 08/319,248, filed on Oct. 6, 1994, which was abandoned upon the filing hereof.

BACKGROUND OF THE INVENTION

1. Field of the Invention

This invention relates to a heating device for use, for example, in a vapor phase epitaxy apparatus to heat a semiconductor wafer, and more particularly to a heating device equipped with an electric resistance heating-type heater.

2. Description of the Related Art

In a vapor phase epitaxy apparatus, in general, an electric resistance heating-type heater is placed such that its heating surface is parallel to the lower surface of a semiconductor wafer (hereinafter simply called "wafer"), to heat the wafer to about 1100° C.

Figure 10:
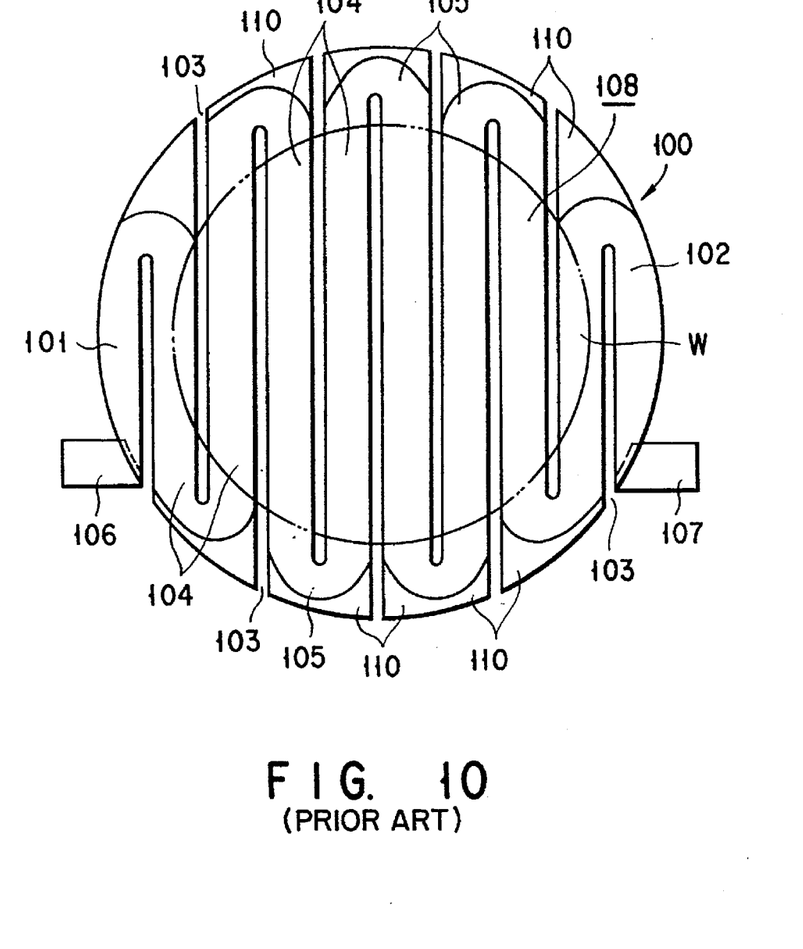
FIG. 10 is a plan view, showing uneven-temperature regions in a heater as a structural element of a conventional heater device.
Figure 11:
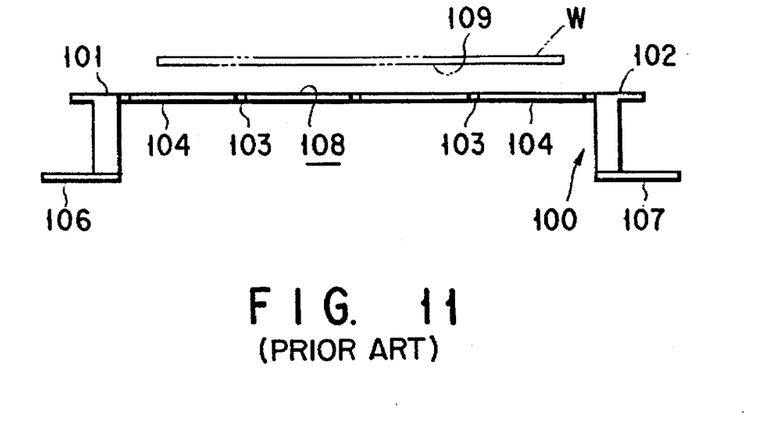
FIG. 11 is a schematic front view of the heater of the conventional heater device.

A conventional heater 100 of this type has a structure as shown in FIGS. 10 and 11.

As is shown in FIG. 10, the heater 100 is formed in a disk-shape, and has opposite side portions 101 and 102 and a plurality of strip heating portions 104. The strip heating portions 104 are separated by a plurality of slits 103 formed between each adjacent pair of them, and extend parallel to one another.

Each adjacent pair of the strip heating portions 104 and the opposite side portions 101 and 102 are connected by a connecting portion 105, thus forming a zigzag current path pattern which extends from a terminal 106 at an end of the left side portion 101, to a terminal 107 at an end of the right side portion 102. The strip heating portions 104 and the opposite side portions 101 and 102 constitute a heating surface 108.

As is shown in FIG. 11, the heater 100 is placed under a wafer W such that the heating surface 108 is parallel to the lower surface 109 of the wafer W of which a surface is to be heated. A power supply (not shown) is provided for creating a current between the terminals 106 and 107 to heat the wafer.

In the above conventional heater 100, each connecting portion 105 of the zigzag current path has a region in which current can easily flow, and an uneven-temperature region 110 in which current can hardly flow.

As described above, the conventional heater 100 has uneven-temperature regions (i.e., low temperature regions) 110 at the edge of the heating surface 108.

However, it is known from experiments that keeping the temperature of the edge of the wafer W uniform is very significant since it greatly reduces slip defects which will occur during manufacturing.

In light of this, in the conventional device, the wafer W to be heated is placed so as not to be opposed to the uneven-temperature regions 110 of the heating surface 108.

Further, in a case where the object to be heated is cylindrical or shaped like a pot, a cylindrical heater is used as the heater 100. In this case, too, the object is placed so as not to be opposed to the uneven-temperature regions of the heater.

In other words, the conventional heater device must employ a heater which has a heating surface of an area larger than that of an object to be heated. As a result, the heater device has a large size and hence its manufacturing cost is inevitably high.

SUMMARY OF THE INVENTION

The present invention has been developed to solve the above problem, and aims to provide a heating device which employs a heater having a size substantially equal to that of the object to be heated and capable of heating the overall object uniformly, and which can be made compact at a low cost; or provide a heating device having the same size as the conventional heater and is capable of uniformly heating a larger object than the conventional one can.

To attain this object, there is provided a heating device incorporating a heater having a heating surface to be opposed parallel to a heated surface of an object for heating the same, the heater comprising:

a plurality of strip heating portions separated by a plurality of slits and having flat surfaces; and connecting portions alternately connecting ends of each adjacent pair of the strip heating portions, thereby forming a heating surface in which a current path having opposite ends thereof connected to terminals extends, the connecting portions being bent so as not to be positioned in the same plane as the heating surface.

Since in the heating device constructed as above, the connecting portions in which uneven-temperature regions (low temperature regions) due to ununiform flow of current exist are bent so as not to be positioned in the same plane as the heating surface, the heating surface to be opposed to an object to be heated has a uniform temperature, and hence it can be made to have the substantially same area as the object. Thus, the heater can be made compact as compared with the conventional heaters, and accordingly the device which incorporates the heater can be made compact at low cost. Further, where the heater has the same size as the conventional heater, it can uniformly heat a larger object than in the conventional case, thus enhancing the treatment efficiency.

Additional objects and advantages of the present invention will be set forth in the description which follows, and in part will be obvious from the description, or may be learned by practice of the present invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the invention.

DETAILED DESCRIPTION OF THE PREFERRED EMBODIMENTS

An embodiment of the invention will be explained with reference to FIGS. 1–5.

Figure 1:
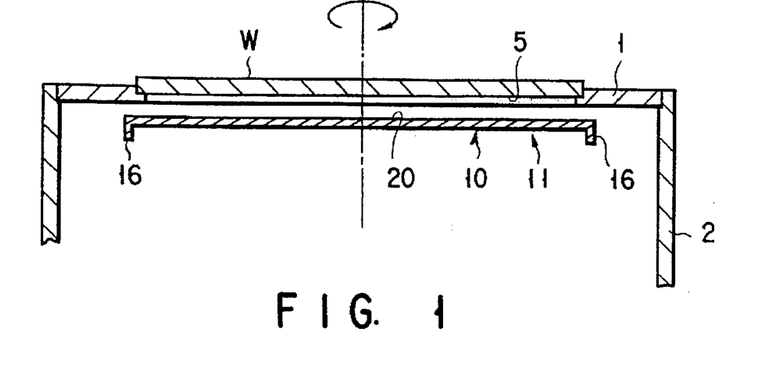
FIG. 1 is a schematic front view, showing a state in a reaction chamber employed in a vapor phase epitaxy apparatus to which a heating device of the invention is applied.

FIG. 1 is a schematic view, showing a state in a reaction chamber employed in a vapor phase epitaxy apparatus. Reference numeral 1 denotes a susceptor as holding means for holding a wafer W to be heated, and reference numeral 2 a susceptor supporter for supporting the susceptor 1, which is rotated by a rotary mechanism (not shown).

An electric resistance heating-type heater 10 is placed under the lower surface (i.e. heated surface) 5 of the wafer W held by the susceptor 1. The heater 10 and the susceptor 1 constitute a heating device 11 for heating the wafer W to about 1100° C.

The heater 10 will be explained in detail with reference to FIGS. 2–4.

Figure 2:
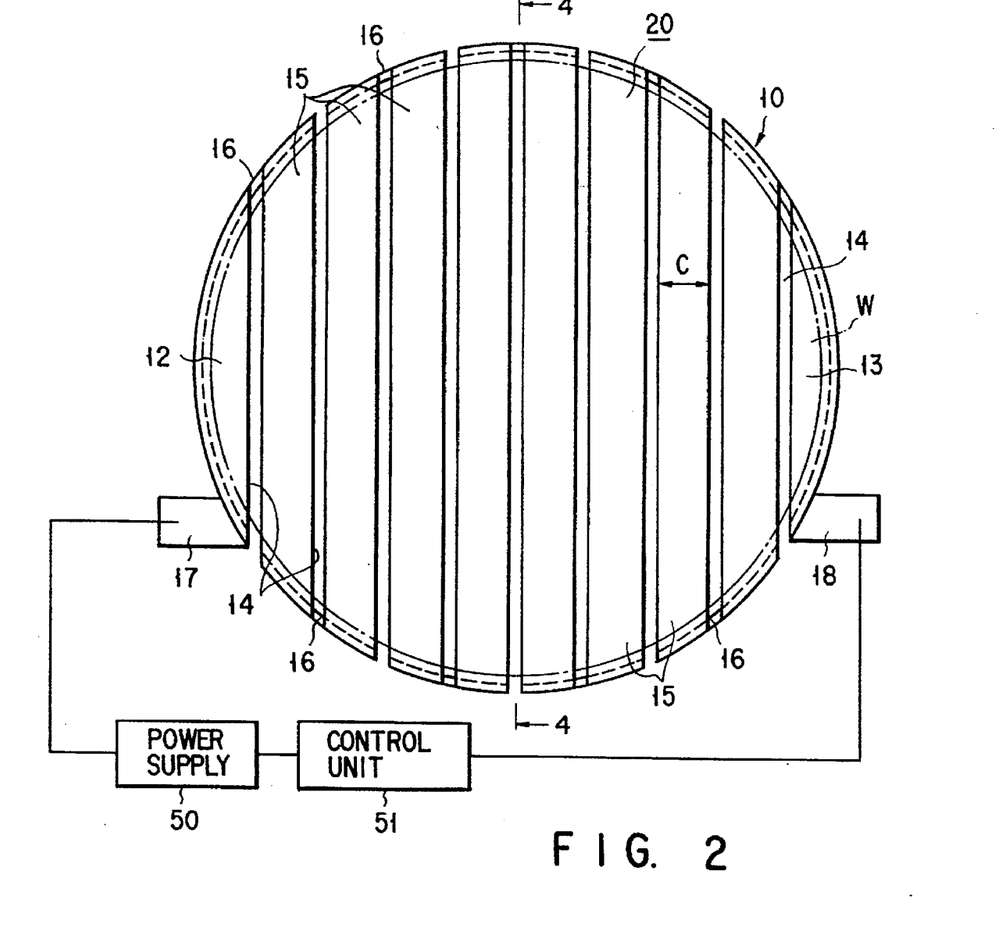
FIG. 2 is a schematic plan view, showing a heater as a structural element of a heating device according to a first embodiment of the invention.
Figure 3:
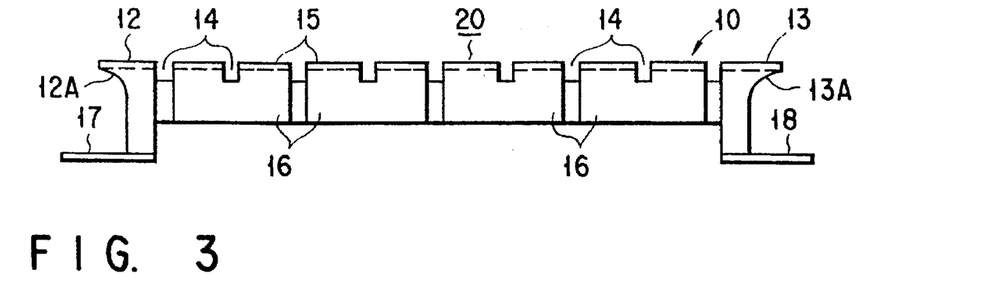
FIG. 3 is a front view of the heater of FIG. 2.
Figure 4:
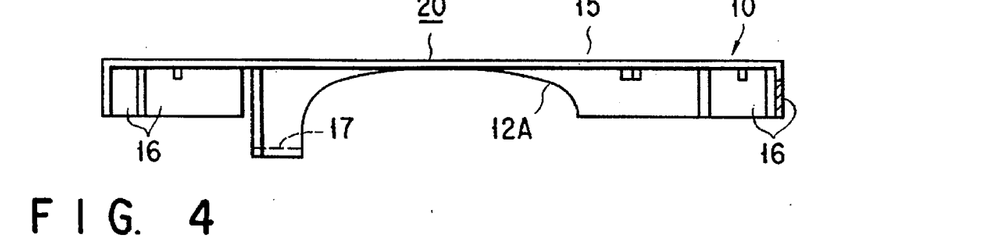
FIG. 4 is a cross sectional view, taken along line 4—4 of FIG. 2.

FIG. 2 is a schematic top view of the heater 10, FIG. 3 is a front view of the same, and FIG. 4 is a cross sectional view, taken along line 4—4 of FIG. 2.

As is shown in FIG. 2, the heater 10 is formed in a disk-shape, and has opposite side portions 12 and 13 and a plurality of strip heating portions 15 having a width C. The strip heating portions 15 are separated by a plurality of slits 14 formed between each adjacent pair of them, and extend parallel to one another.

Each adjacent pair of the strip heating portions 15 and the opposite side portions 12 and 13 are connected by a connecting portion 16, thus forming a zigzag current path pattern which extends from a terminal 17 at an end of the left side portion 12, to a terminal 18 at an end of the right side portion 13. The strip heating portions 15 and the opposite side portions 12 and 13 constitute a heating surface 20 in parallel to the heated surface (lower surface) 5 of the wafer W.

As is shown in FIGS. 3 and 4, each connecting portion 16 is bent downward at right angles to the heating surface 20 so as not to be placed in the same plane as the surface 20.

Figure 5:
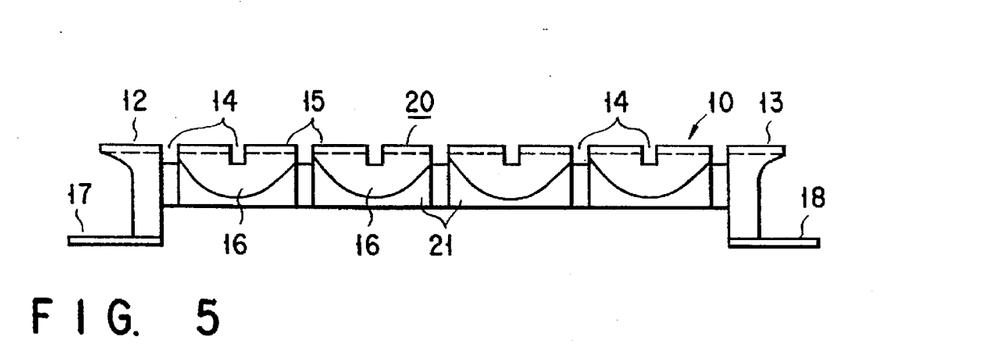
FIG. 5 is a front view, showing uneven-temperature regions of the heater of FIG. 2.

As is shown in FIG. 5, the connecting portion 16 has a region in which current can easily flow, and an uneven-temperature region 21 in which current can hardly flow. All uneven-temperature regions (lower temperature regions) 21 are prevented from appearing on the side of the heating surface 20 as a result of bending the connecting portions 16 at right angles thereto.

As is shown in FIG. 2, a series circuit of a power supply 50 and a control section 51 is connected between the first and second terminals 17 and 18, for supplying heating current therebetween.

Since in the heater 10, the connecting portions 16 having the uneven-temperature regions (low temperature regions) 21 are bent such that the regions 21 are positioned in the same plane as the heating surface 20, that portion of the heating surface 20 which is opposed to the wafer W has a uniform temperature, and hence the heating surface of the heater 10 can be made to have substantially the same area as the wafer W.

Accordingly, the heater 10 can be made smaller than the conventional one. Specifically, the diameter of the heater 10 can be reduced by a length equal to double the width of the connecting portion 16. As a result, the vapor phase epitaxy apparatus which incorporates the heater can be made compact, and the manufacturing cost can be reduced. In other words, if the size of the heater 10 is set to be equal to that of the conventional heater, a larger wafer W can be heated uniformly, thereby enhancing the efficiency of the vapor phase epitaxy apparatus.

Moreover, in the above embodiment, the left and right side portions 12 and 13 of the heating surface 20 do not have a predetermined width as the width C of the strip heating portion 15. In order to prevent an increase in the temperature of a narrow portion of each of the portions 12 and 13, the portions 12 and 13 have their circumferentially center portions bent downward, as indicated by reference signs 12A and 13A in FIG. 4, respectively, thereby setting the widths of the portions 12 and 13 substantially equal to the width C of the strip heating portion 15. Thus, the overall heater 10 is kept uniform in temperature.

Figure 6:
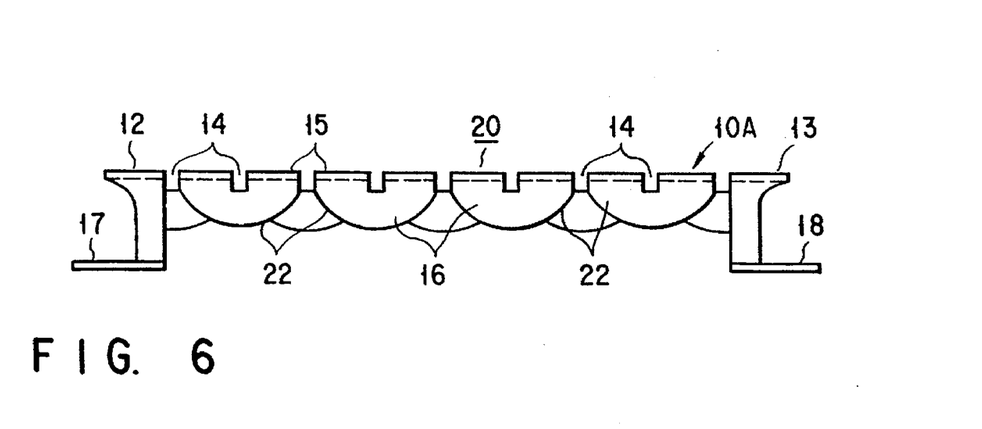
FIG. 6 is a front view of a heater according to a second embodiment of the invention.

FIG. 6 shows a heater 10A according to a second embodiment of the invention. In this embodiment, the heater 10A has arcuate portions 22 obtained by removing from the structure of FIG. 5 to the uneven-temperature regions (low temperature regions) 21. As a result, the area of the low temperature regions 21 is minimized.

Figure 7A:
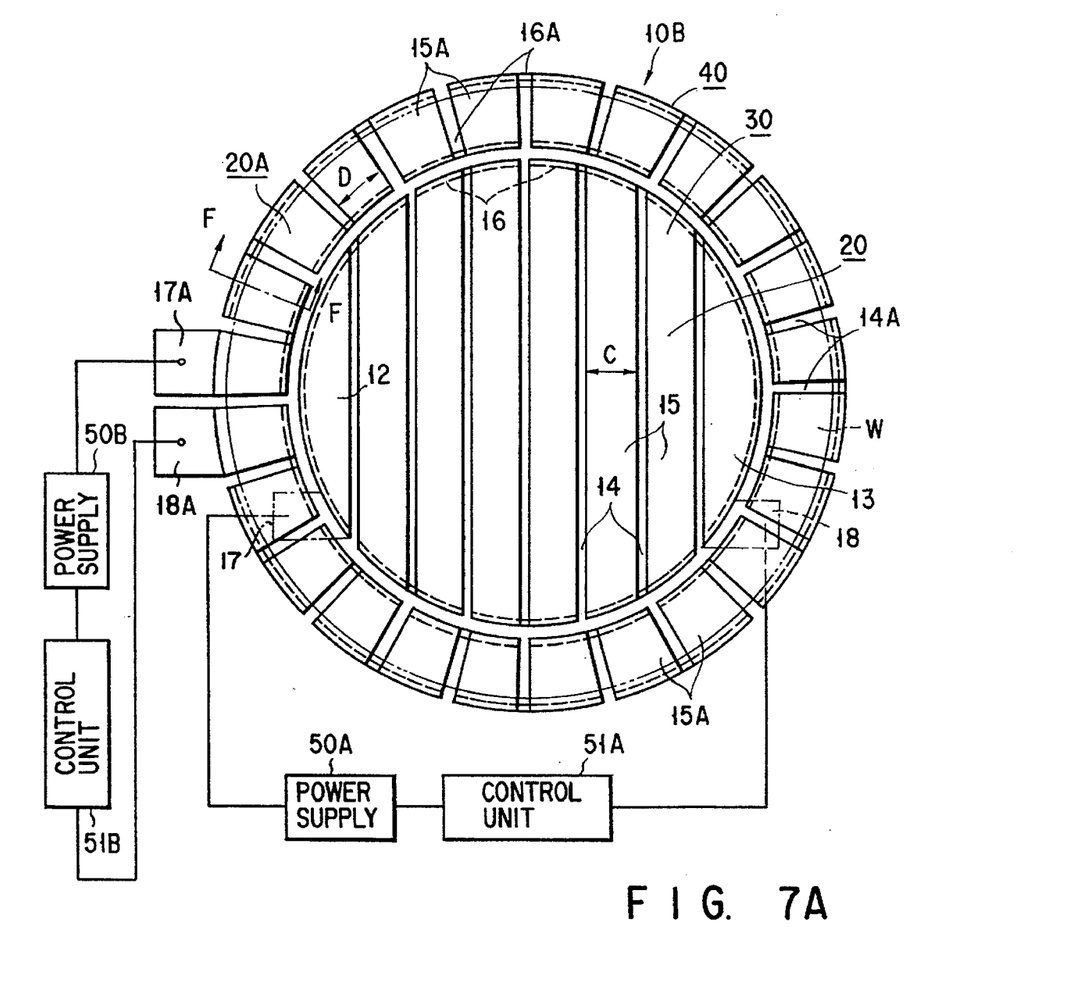
FIG. 7A is a plan view of a heater according to a third embodiment of the invention.

FIG. 7A shows a heater 10B according to a third embodiment of the invention. The heater 10B has a heater 30 with bent connecting portions 16, and a ring heater 40 surrounding the heater 30.

The heater 30 has the same structure as the heater 10. Specifically, the heater 30 is formed in a disk-shape, and has opposite side portions 12 and 13 and a plurality of strip heating portions 15 of a width C separated by a plurality of slits 14 and extending parallel to one another.

Each adjacent pair of the strip heating portions 15 and the opposite side portions 12 and 13 are connected by a connecting portion 16, thus forming a zigzag current path pattern which extends from a terminal 17 at an end of the left side portion 12, to a terminal 18 at an end of the right side portion 13. The strip heating portions 15 and the opposite side portions 12 and 13 constitute a heating surface 20 opposed parallel to the heated surface (lower surface) 5 of the wafer W.

Figure 7B:
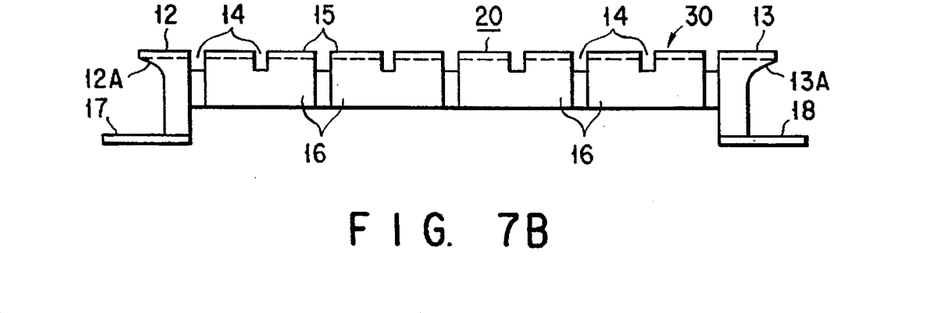
FIG. 7B is a front view of a heater according to the third embodiment of the invention.
Figure 7C:
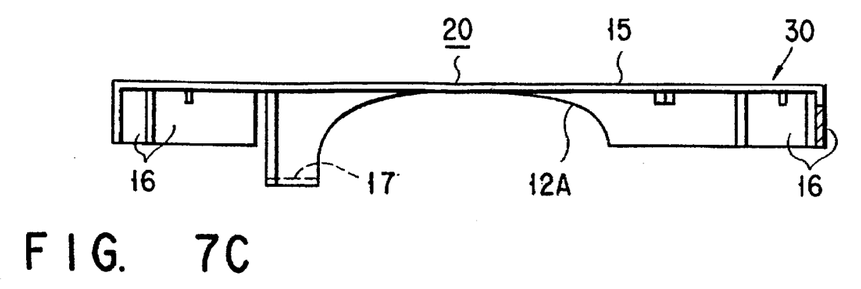
FIG. 7C is a cross sectional view of a heater according to the third embodiment of the invention.

As is shown in FIGS. 7B and 7C, each connecting portion 16 is bent downward at right angles to the heating surface 20 so as not to be placed in the same plane as the surface 20.

Figure 7D:
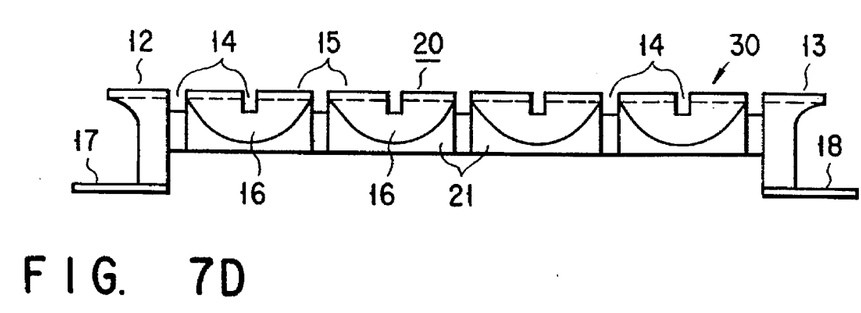
FIG. 7D is a front view, showing uneven-temperature regions of the heater of FIG. 7A.

As is shown in FIG. 7D, the connecting portion 16 has a region in which current can easily flow, and an uneven-temperature region (a dotted region) 21 in which current can hardly flow. All uneven-temperature regions (lower temperature regions) 21 are prevented from appearing on the side of the upper surface of the heater 30, i.e., on the side of the heating surface 20, as a result of bending the connecting portions 16 at right angles thereto.

Moreover, in this embodiment, the left and right side portions 12 and 13 of the heating surface 20 do not have a predetermined width as the width C of the strip heating portion 15. In order to prevent an increase in the temperature of a narrow portion of each of the portions 12 and 13, the portions 12 and 13 have their circumferentially center portions bent downward, as indicated by reference signs 12A and 13A in FIGS. 7B and 7C, respectively, thereby setting the widths of the portions 12 and 13 substantially equal to the width C of the strip heating portion 15. Thus, the overall heater 10 is kept uniform in temperature.

Figure 7E:
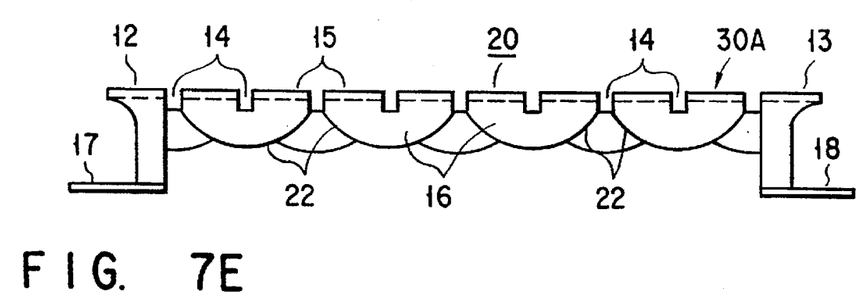
FIG. 7E is a front view, showing a state in which uneven-temperature regions are removed.

FIG. 7E shows a modification of the heater 30A. This heater 30A has arcuate portions 22 obtained by removing from the structure of FIG. 7D dotted edge portions corresponding to the uneven-temperature regions (low temperature regions) 21. As a result, the area of the low temperature regions 21 is minimized.

The heater 40 has a plurality of short strip heating portions 15A radially extending and separated by a plurality of slits 14A, and connecting portions 16A consisting of inner and outer circumferential edges bent at right angles to a heating surface 20A such that they are not positioned in the same plane as the heating surface 20A. The connecting portions 16A connect the heating portions 15A to one another. Reference signs 17A and 18A denote terminals.

A series circuit consisting of a power supply 50A and a control unit 51A is connected between the first and second terminals 17 and 18 of the heater 30, for supplying a heating current therebetween. Further, a series circuit consisting of a power supply 50B and a control unit 51B is connected between the terminals 17A and 18A of the heater 40, for supplying a heating current therebetween.

Figure 7F:
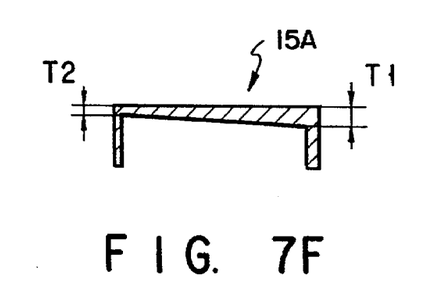
FIG. 7F is a cross sectional view, taken along line F—F of FIG. 7A.

Although the width D of the strip heating portions 15A increases from the inner circumferential edge to the outer circumferential edge, the temperature of each heating portion 15A can be kept constant in the radial direction by varying the thickness thereof such that the inner circumferential edge has a thickness T1 greater than the thickness T2 of the outer circumferential edge, as is shown in FIG. 7F.

The heaters 30 and 40 are set at different temperatures so as to impart a desired distribution of temperature in the radial direction. Since the overall surface of each of the heaters 30 and 40 is kept at a predetermined temperature, there is no uneven-temperature region (low temperature region) in a transition zone between the heaters 30 and 40, and hence the wafer W can accurately be set to have a desired temperature distribution in the radial direction.

Figure 8:
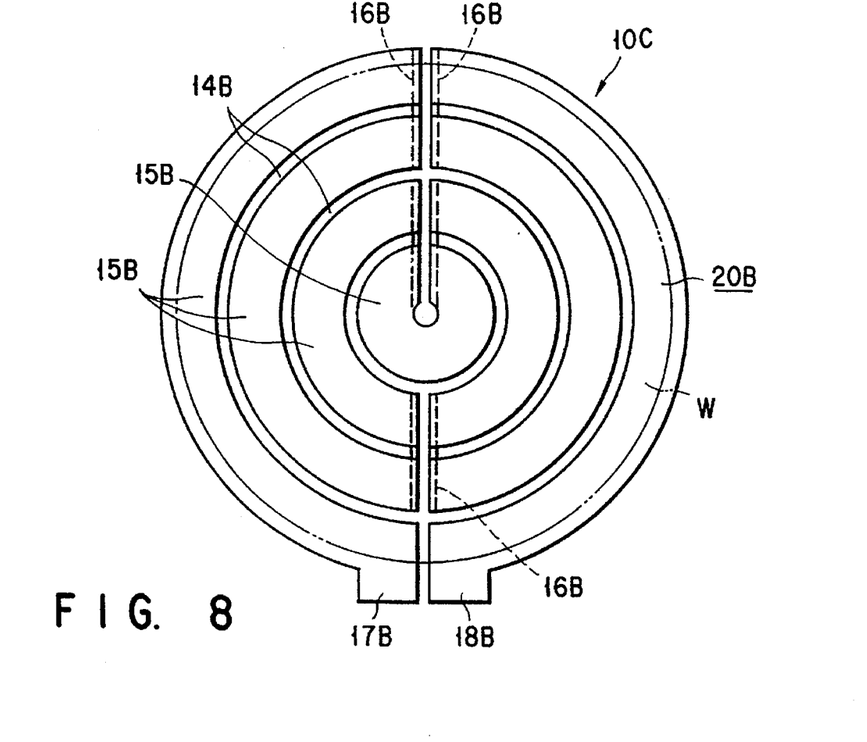
FIG. 8 is a plan view, showing a fourth embodiment of the invention.

FIG. 8 shows a heater 10C according to a fourth embodiment of the invention. The heater 10C has a plurality of concentric heating portions 15B separated by a plurality of slits 14B and connected to one another by means of a plurality of connecting portions 16B, which are bent at right angles to the heating portions 15B so as not to be positioned in the same plane as its heating surface 20B. A series circuit consisting of a power supply and a control unit (both are not shown) is connected between opposite terminals 17B and 18B for supplying a heating current therebetween.

Like the above-described heaters, the overall heating surface 20B of the heater 10C which is to be opposed to the wafer W has a uniform temperature, and therefore the heater 10C can be formed with the same area as the wafer W.

Figure 9:
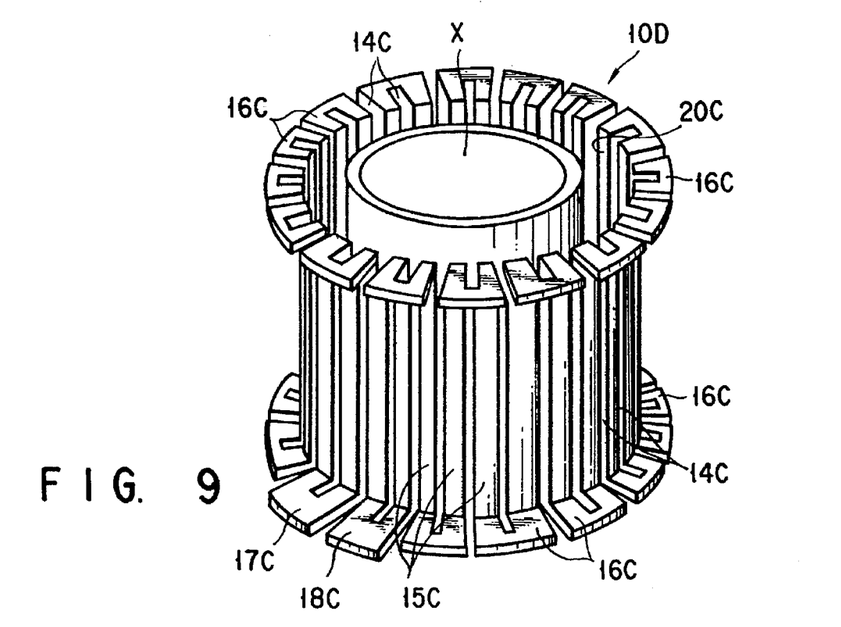
FIG. 9 is a perspective view, showing a fifth embodiment of the invention.

FIG. 9 shows a cylindrical heater 10D according to a fifth embodiment of the invention. The heater 10D is used to heat an object which is cylindrical or shaped like a pot.

The heater 10D has a plurality of strip heating portions 15C of a predetermined width, which extends in parallel to one another at regular intervals with a slit 14C formed between each adjacent pair of the portions 15C; and a plurality of connecting portions 16C connecting the heating portions 15C to one another. Thus, the inner surfaces of the heating portions 15C constitute a heating surface 20C. The connecting portions 16C are bent outward in the form of a flange so as not to be positioned in the same plane as the heating surface 20C. A series circuit consisting of a power supply and a control unit (both are not shown) is connected between terminals 17C and 18C for supplying a heating current therebetween.

Since the connecting portions 16C having uneven-temperature regions (low temperature regions) are bent so as not to be positioned in the same plane as the heating surface 20C, the heating surface of the heater 10D which is opposed to a cylindrical or pot-like object X has a uniform temperature, and hence the heater 10D can be made to have a length (height) substantially equal to the object to be heated X.

The above-described structure enables the heater 10D to be made smaller than the conventional heater. Specifically, the length of the heater 10D can be reduced by a length equal to double the width of the connecting portion 16C, with the result that an apparatus incorporating this heater can be made smaller and at a lower cost. Further, if the length of the heater is made equal to that of the conventional one, it can uniformly heat a larger object than the conventional heater, thus enhancing the efficiency of the apparatus.

Moreover, although in the above embodiments, the connecting portions 16 (16A, 16B, 16C) are bent at right angles, the bending angle is not limited as such, but may be changed to an acute angle or an obtuse angle. In this case, too, a similar advantage can be obtained.

It is a matter of course that the invention may be modified in various manners without departing from the scope thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heating device incorporating a disk-shaped heater having a heating surface substantially parallel to a surface of an object to be heated, and a ring-shaped heater surrounding the disk-shaped heater, the disk-shaped heater comprising:

opposite end portions;

a plurality of strip heating portions of a predetermined width placed between the opposite end portions, separated by a plurality of slits and extending substantially parallel to one another; and connecting portions connecting the bent portions of each adjacent pair of the strip heating portions and the opposite end portions, thereby forming a heating surface in which a current path has bent portions thereof connected to terminals, the connecting portions extending so that they are not positioned in the same plane as the heating surface;

the ring-shaped heater comprising:

a plurality of short strip heating portions separated by a plurality of slits extending radially; and connecting portions alternately connecting inner circumferential ends and outer circumferential ends of the strip heating portions, thereby forming a current path having opposite ends connected to terminals, the connecting portions extending so that they are not positioned in the same plane as the heating surface of the disk-shaped heater.

2. The heating device according to claim 1, wherein each connecting portion of the disk-shaped heater is bent at right angles to the heating surface in a direction opposite the heating surface, so that they are not positioned in the same plane as the heating surface.

3. The heating device according to claim 1, wherein the opposite end portions of the heating surface of the disk-shaped heater each have a bent portion obtained by bending an outer circumferential portion thereof, the bent portion having a width substantially equal to the width of each of the strip heating portions.

4. The heating device according to claim 1, wherein each of the connecting portions of the disk-shaped heater has an arcuate edge portion obtained by removing an uneven-temperature region.

5. The heating device according to claim 1, wherein each of the strip heating portions of the ring-shaped heater has a thickness which varies such that an inner circumferential side is thicker than an outer circumferential side.

* * * * *